United States Patent
Jun et al.

[19]

[11] Patent Number: 6,069,821
[45] Date of Patent: May 30, 2000

[54] DEVICE FOR SENSING DATA IN A MULTI-BIT MEMORY CELL USING A MULTISTEP CURRENT SOURCE

[75] Inventors: Si Bum Jun; Dae Mann Kim, both of Kyungsangbuk-do; Woong Lim Choi, Chungcheongbuk-do, all of Rep. of Korea

[73] Assignee: Hyundai Electronics Industries Co., Ltd., Kyoungki-do, Rep. of Korea

[21] Appl. No.: 09/427,273

[22] Filed: Oct. 26, 1999

[30] Foreign Application Priority Data

Nov. 26, 1998 [KR] Rep. of Korea ............... 98/50969

[51] Int. Cl.[7] ............................................ G11C 16/06
[52] U.S. Cl. ..................... 365/185.21; 365/185.03; 365/185.2; 365/189.06; 365/189.07; 365/189.09
[58] Field of Search ................. 365/185.21, 185.03, 365/185.2, 189.06, 189.07, 189.09

[56] References Cited

U.S. PATENT DOCUMENTS

| | | | |
|---|---|---|---|
| 4,964,079 | 10/1990 | Devin | 365/185.03 |
| 5,003,510 | 3/1991 | Kamisaki | 365/189.01 |
| 5,163,021 | 11/1992 | Mehrotra et al. | 365/185.03 |
| 5,268,870 | 12/1993 | Harari | 365/185.09 |

*Primary Examiner*—Andrew Q. Tran
*Attorney, Agent, or Firm*—Fleshner & Kim, LLP

[57] ABSTRACT

A device and method for sensing data in a multi-bit memory cell of a memory cell array unit is provided where each memory cell has at least two threshold voltage levels. The device can include a multistep current source unit to provide quantized voltages, each having a width smaller than a threshold voltage distribution in a selected memory cell, according to a current flowing through the selected memory cell. An analog-to-digital converter compares the quantized voltages from the multistep current source unit with a plurality of reference voltages to provide a state of the memory cell in binary form. The device and method for sensing data in the multi-bit memory cell uses the quantized voltages to increase sensing reliability, increases sensing speed and increases a gap between the quantized voltages relative to the threshold voltage distribution.

25 Claims, 11 Drawing Sheets

| AB | 00 | 01 | 10 | 11 |
|---|---|---|---|---|
| X1 | L | H | H | H |
| X2 | L | L | H | H |
| X3 | L | L | L | H |

DEVICE FOR SENSING DATA IN A MULTI-BIT MEMORY CELL USING A MULTISTEP CURRENT SOURCE

BACKGROUND OF THE INVENTION

1. Field of the Invention

The present invention relates to a semiconductor device, and more particularly, to a device for sensing a data in a multi-bit memory cell.

2. Background of the Related Art

In general, semiconductor memories come in two varieties: volatile and nonvolatile. In a volatile memory, information recorded therein can be erased and new information can then be stored in the same memory. Included in this memory category is the random access memory (RAM). In a non-volatile memory, on the other hand, once information is recorded, it can be retained permanently in the memory.

A read only memory (ROM) is a non-volatile memory that cannot be reprogrammed once information is written to it. On the other hand, an erasable programmable read only memory (EPROM) and an electronically erasable programmable read only memory (EEPROM) are non-volatile memories that have the capacity to be erased and reprogrammed with new information that will remain until the device is erased again. The programming operations of the EPROM and the EEPROM are the same, but the erasing operations are different. The EPROM uses an ultraviolet light to erase information stored thereon, while the EEPROM use electricity to erase information stored thereon.

As information industries develop, large sized memories become necessary. The Dynamic RAM (DRAM) is one of the most widely used mass storage medias to meet such a requirement. A drawback of the DRAM, however, is that a relatively large storage capacitor is required, which necessitates reflash operations in fixed intervals. Consequently, the EEPROM has been studied as a possible replacement for the DRAM, since the EEPROM requires no reflash operations.

The EEPROM memory, however, can only record data of either a "1" or a "0" on one memory cell. Hence, the packing density of the EEPROM memory corresponds to the number of memory cells in a one to one fashion. Therefore, the largest drawback to the EEPROM is that cost-per-bit of the memory is too expensive.

In order to solve this problem, studies on multibit-per-cell EEPROMs have been recently proposed. The multibit-per-cell EEPROMs store data of two bits or more in one memory cell, thereby enhancing the density of data on the same chip area without reducing the size of the memory cell. For the multibit-per-cell memory, multi-threshold voltage levels should be programmed on the respective memory cells. For instance, in order to store data of more than two bits for every cell, the respective cells must be programmed in $2^2$, that is, four, threshold levels. Here, the four threshold levels correspond to logic states 00, 01, 10, and 11, respectively. To increase the number of bits that can be stored in every cell, more threshold levels need to be programmed for each cell by precisely adjusting the respective threshold levels, thus reducing a distribution width of the threshold voltage levels.

A related art device for sensing multi-level programmed data will be described with reference to the attached drawings. FIG. 1a illustrates a related art circuit for sensing data from a multi-bit cell, and FIG. 1b illustrates a table for detecting a data storage state in a memory cell by a sensing operation of the related art circuit in FIG 1a. In the related art circuit for sensing a data from a multi-bit cell, the multi-bit cell is sensed with reference to a voltage.

Referring to FIG. 1a, the related art circuit for sensing data from a multi-bit cell is provided with a memory cell 1 for storage of data, a first PMOS transistor PM1 having a source terminal in contact with a drain terminal of the memory cell 1 at a first contact node CN1 and a gate terminal connected to the source terminal, and a reference voltage generating unit 5 for generating a plurality of reference voltages. First, second, and third comparing units 2, 3, and 4 compare a voltage from the memory cell to first, second, and third reference voltages Vref1, Vref2, and Vref3 generated in a reference voltage generating unit 5 respectively. A decoding logic unit 6 receives signals X1, X2, and X3 from the first, second, and third comparing units 2, 3, and 4 and decodes a data storage state of the memory cell 1. The drain terminal of the first PMOS transistor PM1 is supplied with a source voltage $V_{DD}$.

The memory cell 1 is selected when a Vin signal is provided thereto. Then, the data stored in the memory cell is provided to the first, second, and third comparing units 2, 3, and 4 through the first contact node CN1, and compared to the first, second, and third reference voltages Vref1, Vref2, and Vref3 to provide the outputs X1, X2, and X3. The decoding logic unit 6 receives the outputs X1, X2, and X3 and converts and outputs the data from the memory cell in a binary form.

A process for sensing the data storage state of the related art memory cell 1 when Vref1<Vref2<Vref3 will be described with reference to FIG. 1b. It is assumed that the multi-bit memory cell has been programmed on four levels 00, 01, 10, and 11 of threshold voltages. First, when a voltage lower than first reference voltage the Vref1 is provided to the first, second, and third comparing units 2, 3, and 4 through the first contact node CN1, each of the outputs X1, X2, and X3 from the first, second, and third comparing units 2, 3, and 4 are at a low level L. On reception of the output signals X1, X2, and X3, the decoding logic unit 6 outputs a 0 through both the A terminal and the B terminal. These outputs indicate that the data stored in the memory cell 1 is at a (00)th level of the four levels of a 00, 01, 10, and 11.

When a voltage higher than the first reference voltage Vref1, but lower than the second reference voltage Vref2 is provided to the first, second, and the third comparing units 2, 3, and 4 through the first contact node CN1, a high signal H is provided from the output terminal X1 on the first comparing unit 2, and low signals L are provided both from the second and third comparing units 3 and 4. Upon reception of the output signals, the decoding logic unit 6 provides 0, 1 from the A terminal and the B terminal, respectively. This output indicates that the data stored in the memory cell 1 is programmed to (01)th level of the four levels.

Next, when a voltage higher than the second reference voltage Vref2, but lower than the third reference voltage Vref3 is provided to the first, second, and third comparing units 2, 3, and 4 through the first contact node CN1, high signals H are provided from the output terminals X1 and X2 on the first and second comparing units 2, and 3, and a low signal L is provided from the output terminal X3 on the third comparing unit 4. Upon reception of the output signals, the decoding logic unit 6 provides 1, 0 from the A terminal and the B terminal, respectively, indicating that the data stored in the memory cell 1 is programmed to (10)th level of the four levels.

Finally, when a voltage higher than the third reference voltage Vref3 is provided to the first, second, and third comparing units 2, 3, and 4 through the first contact node CN1, high signals H are provided from the output terminals X1, X2, and X3 on the first, second, and third comparing units 2, 3, and 4. Upon reception of the output signals, the decoding logic unit 6 provides 1, 1 from the A terminal and the B terminal respectively, indicating that the data stored in the memory cell 1 is programmed to (11)th level of the four levels.

Referring to FIGS. 2a and 2b, the related art circuit for sensing data from a multi-bit memory cell compares a voltage distribution at the first contact node CN1 (i.e., a sensing node) coming from the threshold voltages of the memory cell to the generated reference voltages. That is, $\Delta V_M = \Delta V_M'$ (where $\Delta V_M$=a gap between the threshold voltages and $\Delta V_M'$=a gap between sensing node voltages). When the threshold voltage distribution of the memory cell is used as the sensing node voltage distribution as it is, it may be difficult to set the reference voltages precisely if the gaps between the threshold voltages are narrow. The threshold voltage is dependent on various external factors such as fabrication process, temperature, trap charge in a tunnel oxide film in the memory, and so on.

As described above, the related art circuit for sensing a data from a multi-bit memory cell has various problems. For example, a plurality of reference voltages or a plurality of reference currents are used for sensing a programmed or erased state of a multi-bit memory cell with a plurality of threshold voltage levels. Since a threshold voltage distribution inevitably occurs because of a variety of external parameters, such as variation of process characteristics, precision of the reference voltages, and temperature variation, the sensing reliability drops because the threshold voltage distribution is used as it is. Additionally, since gaps between threshold voltages become narrower as a number of bits increases the widths of the threshold voltages increase relatively, and the sensing reliability drops.

The above references are incorporated by reference herein where appropriate for appropriate teachings of additional or alternative details, features and/or technical background.

SUMMARY OF THE INVENTION

An object of the present invention is to provide a device and method for sensing a data in a multi-bit memory cell that substantially obviates one or more of the problems caused by the disadvantages of the related art.

Another object of the present invention is to provide a device and method that senses data in a multi-bit memory cell to increase sensing reliability.

Another object of the present invention is to provide a device and method that senses data in a multi-bit memory cell to increase sensing speed.

Another object of the present invention is to provide a device for sensing a data in a multi-bit memory cell that implements a greater read allowance of a nonvolatile memory cell with a multi-bit threshold voltage levels.

To achieve these objects and other advantages in a whole or in parts and in accordance with the purpose of the present invention, as embodied and broadly described, the device for sensing a data in a multi-bit memory cell includes a memory cell array unit, each memory cell having at least two threshold voltage levels, a multistep current source unit for providing quantized voltages each having a width smaller than a threshold voltage distribution in the memory cell according to a current flowing through the memory cell selected arbitrarily from the memory cell array unit, and an analog-to-digital converter for comparing the quantized voltages from the multistep current source unit and a plurality of reference voltages, to provide a state of the memory cell in a binary data Each memory cell in a programmable memory either programed or erased to have multi-bit threshold voltage levels has an inevitable threshold voltage distribution due to degradation of the cell, program circuit based errors, temperature variation and the like. Reduction of widths of the threshold voltage distribution and increasing gaps between the distributions are important factor for improving a reliability of a sensing operation. A threshold voltage quantization technique is applied to the threshold voltage distribution, to generate quantized voltages, based on which a memory cell read operation is conducted. Here, the quantization technique is matching a plurality of voltage distribution having arbitrary distribution and gaps between the distribution to quantized voltages in one to one fashion, respectively.

It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1a is a drawing that illustrates a related art circuit for sensing a data in a multi-bit cell;

FIG. 1b is a drawing that illustrates a table for detecting a data storage state in a memory cell by a sensing operation of the related art circuit in FIG. 1a;

FIG. 4a is a drawing that illustrates a block diagram of a device for sensing data in a multi-bit memory cell in accordance with another preferred embodiment of the present invention;

FIG. 4b is a drawing that illustrates a table showing the data storage states in a memory cell for sensing by the device in FIG. 4a;

FIG. 5 is a drawing that illustrates a multistep type current-voltage characteristic of the multistep current source unit in FIG. 4a;

FIG. 6 is a drawing that illustrates a voltage distribution mapped for sensing data stored in the multi-bit memory cell of FIG. 4a;

FIG. 8 is a drawing that illustrates simulation data showing a small signal output resistance of the multistep current source unit of FIG. 4a;

DETAILED DESCRIPTION OF PREFERRED EMBODIMENTS

Figures 1A, 1B:
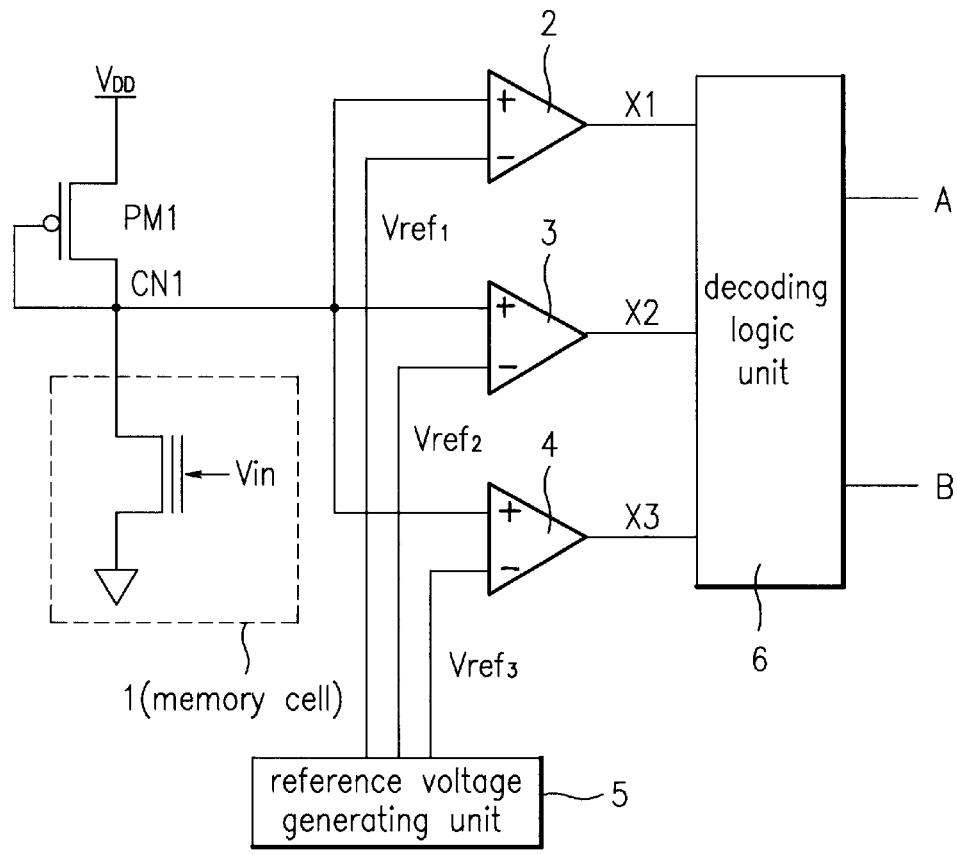
Figure 2A:
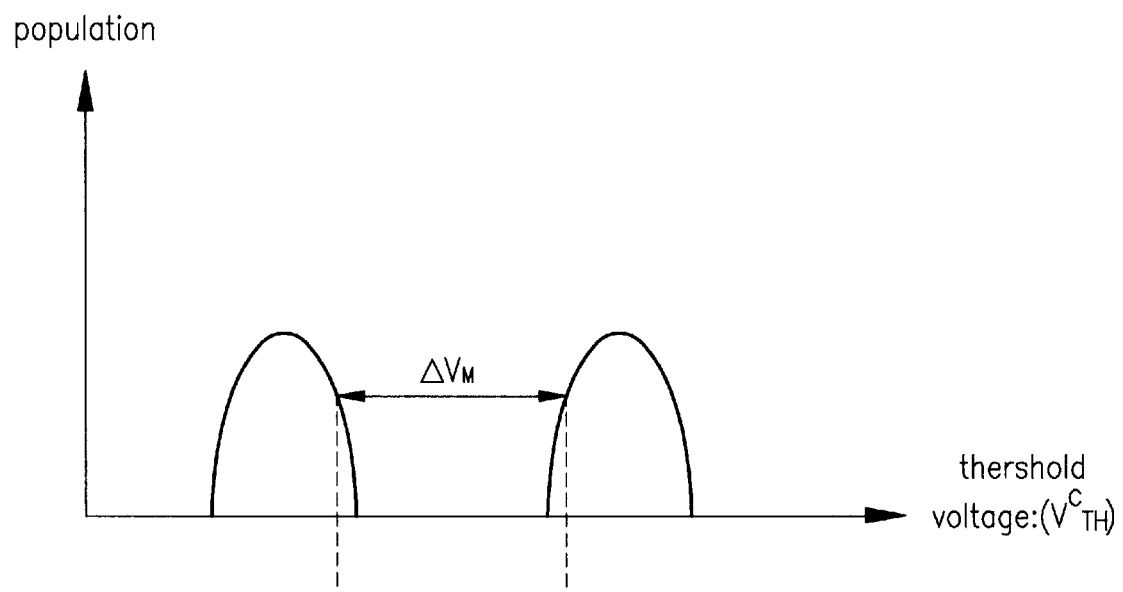
FIG. 2a is a drawing that illustrates a threshold voltage distribution of a related art memory cell.
Figure 2B:
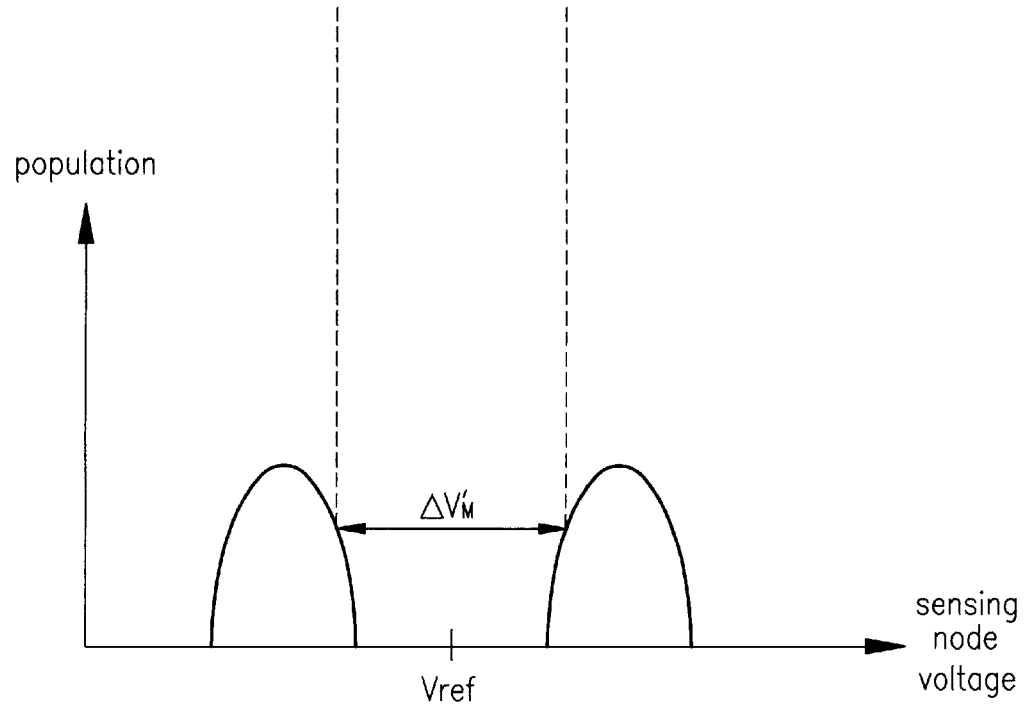
FIG. 2b is a drawing that illustrates a voltage distribution of a related art sensing node.
Figure 3:
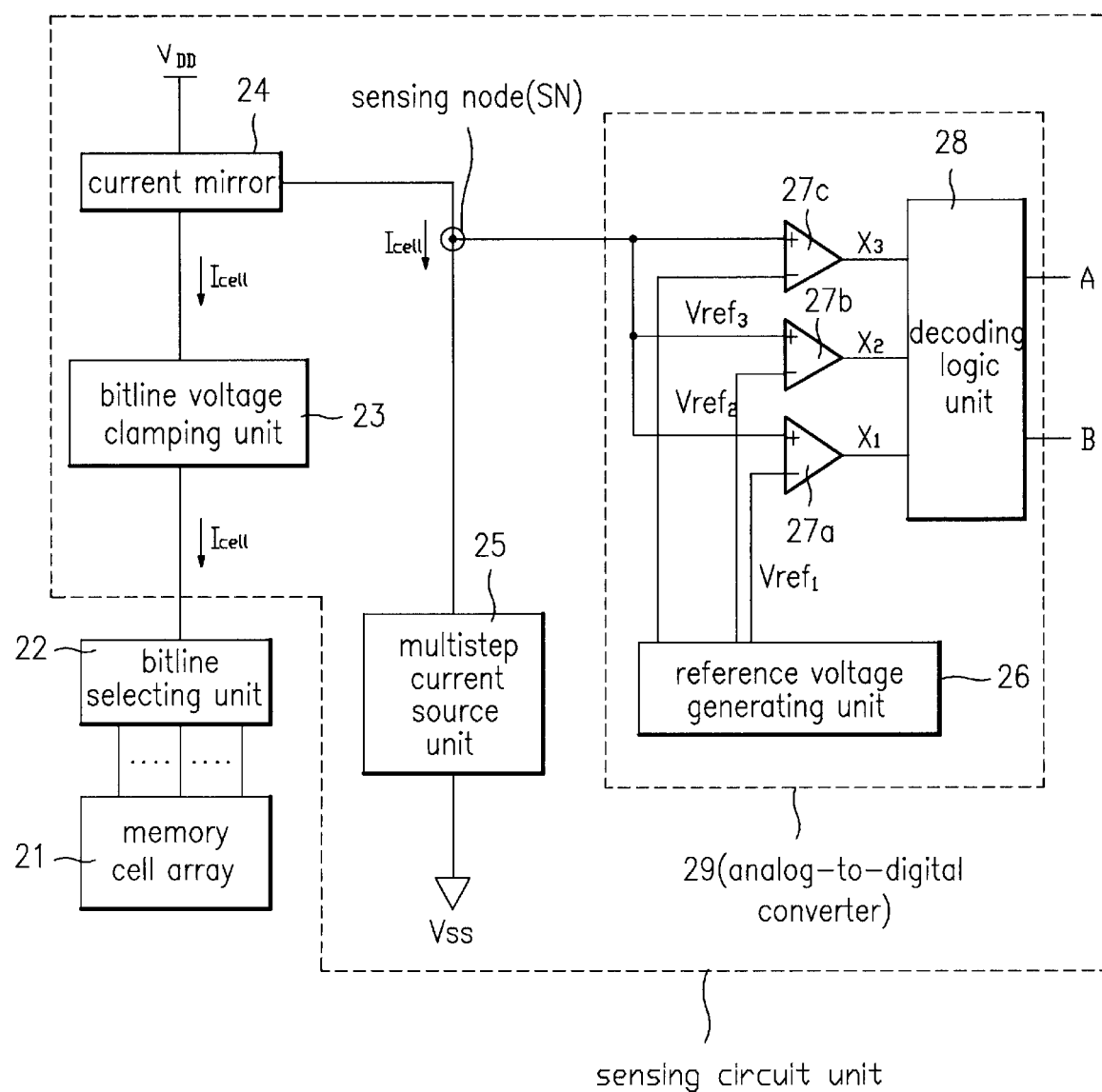
FIG. 3 is a drawing that illustrates a block diagram of a device for sensing data in a multi-bit memory cell in accordance with a preferred embodiment of the present invention.

Reference will now be made in detail to the preferred embodiments of the present invention, examples of which are illustrated in the accompanying drawings. Referring to FIG. 3, a device for sensing data in a multi-bit memory cell in accordance with a first preferred embodiment of the present invention includes a memory cell array unit 21 having a plurality of memory cells each coupled to a wordline and a bitline and having at least two threshold voltage levels stored therein. A bitline selecting unit 22 selects a prescribed memory cell from the memory cell array unit 21, and a bitline voltage clamping unit 23 prevents sharp voltage variations of a bitline to the selected memory cell and holds a voltage on the bitline constant. Additionally, a current mirror 24 supplies a current identical to a current flowing through the bitline to a sensing node SN, and a multistep current source unit 25 preferably supplies a quantized voltage (i.e., a voltage having a distribution width narrower than a distribution width of a threshold voltage of the memory cell) to the sensing node SN according to the current supplied to the sensing node SN.

First, second, and third voltage comparing units 27a, 27b, and 27c compare the quantized voltage supplied from the multistep current source unit 25 to the sensing node SN to each reference voltage distributed from a reference voltage generating unit 26. The reference voltage generating unit 26 respectively distributes first, second, and third reference voltages Vref1, Vref2, and Vref3 to the first, second, and third voltage comparing units 27a, 27b, and 27c. A decoding logic unit 28 preferably receives and decodes voltages compared in and forwarded from the first, second, and third voltage comparing units 27a, 27b, and 27c. The reference voltage generating unit 26, the first, second, and third voltage comparing units 27a, 27b, and 27c, and the decoding logic unit 28 together can serve as an analog-to-digital converter 29 for converting an analog signal sensed at the sensing node SN into a digital signal. Additionally, the bitline voltage clamping unit 23, the current mirror 24, the multistep current source unit 25, the reference voltage generating unit 26, the first, second, and third voltage comparing units 27a, 27b, and 27c, and the decoding logic unit 28 compose one sensing circuit unit.

Figures 4A, 4B:
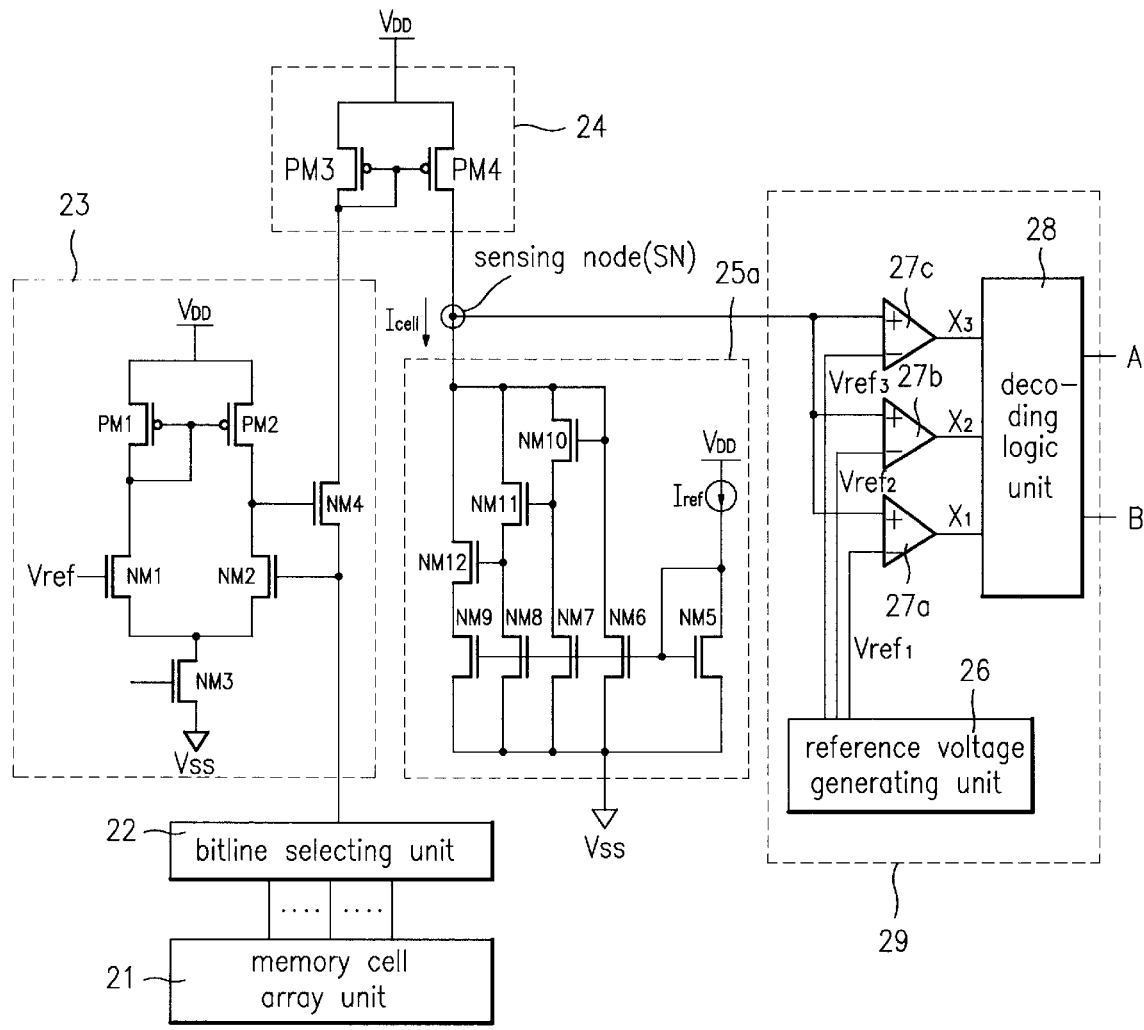

Referring to FIG. 4a, a diagram showing a device for sensing data in a multi-bit memory cell in accordance with a second preferred embodiment of the present invention is illustrated. In the second preferred embodiment, the bitline clamping unit 23 is a negative feed back circuit that utilizes simple differential amplification. The bitline clamping unit 23 clamps a voltage on the bitline, which is selected through the bitline selecting unit 22 to the memory cell in the memory cell array unit 21, to the reference voltage Vref to apply a constant DC bias to a drain (bitline) of the memory cell in a read operation.

The bitline clamping unit 23 preferably includes first and second PMOS transistors PM1 and PM2 having source terminals coupled together and gate terminals coupled together. A first NMOS transistor NM1 has a drain terminal coupled to a drain terminal of the first PMOS transistor PM1, and a second NMOS transistor has a common source terminal with the first NMOS transistor NM1. The second NMOS transistor further has a drain terminal coupled to a drain terminal of the second PMOS transistor PM2 and a gate terminal coupled to the bitline to the memory cell selected through the bitline selecting unit 22. The bitline clamping unit 23 further includes a third NMOS transistor NM3 having a drain terminal coupled to the common source terminal on the first and second NMOS transistors NM1 and NM2 and a source terminal coupled to a ground terminal. A fourth NMOS transistor NM4 of the bitline clamping unit 23 has a source terminal coupled to the bitline selecting unit 22, a drain terminal coupled to the current mirror 24, and a gate terminal in contact with the drain terminal of the second PMOS transistor PM2. The gate terminal and the drain terminal of the first PMOS transistor PM1 are coupled together.

The current mirror 24 includes third and fourth PMOS transistors PM3 and PM4. The third PMOS transistor PM3 has a gate terminal coupled to a drain terminal of the third PMOS transistor PM3 and to a gate terminal of the fourth PMOS transistor PM4, a drain terminal coupled to a drain terminal of the fourth NMOS transistor NM4, and a source terminal coupled to a source terminal of the fourth PMOS transistor PM4. A drain terminal of the fourth PMOS transistor PM4 is coupled to the sensing node SN.

If the selected memory cell in the second preferred embodiment according to the present invention has two bits of threshold voltage levels, the multistep current source unit 25 includes fifth, sixth, seventh, eighth, ninth, tenth, eleventh, and twelfth NMOS transistors NM5, NM6, NM7, NM8, NM9, NM10, NM11, and NM12, where gate terminals of the fifth, sixth, seventh, eighth, and ninth NMOS transistors NM5, NM6, NM7, NM8, and NM9 are coupled together in common. Source terminals of the fifth, sixth, seventh, eighth, and ninth NMOS transistors NM5, NM6, NM7, NM8, and NM9 are coupled to a ground terminal. The fifth NMOS transistor NM5 has a drain terminal coupled to a current source Iref and the gate terminal of the fifth NMOS transistor NM5.

Drain terminals of the tenth, eleventh, and twelfth NMOS transistors NM10, NM11, and NM12 are commonly coupled to the sensing node SN. The tenth NMOS transistor NM10, coupled to a diode, has a source terminal coupled to a drain terminal of the seventh NMOS transistor NM7 and a gate terminal coupled to both a drain terminal of the sixth NMOS transistor NM6 and the drain terminal of the tenth NMOS transistor NM10. The eleventh NMOS transistor NM11 has a source terminal coupled to a drain terminal of the eighth NMOS transistor NM8 and a gate terminal coupled to a drain terminal of the seventh NMOS transistor NM7. Next, the twelfth NMOS transistor NM12 has a source terminal coupled to the drain terminal of the ninth NMOS transistor NM9 and a gate terminal coupled to the drain terminal of the eighth NMOS transistor NM8.

In the second preferred embodiment, the multistep current source unit 25a includes four branches (e.g., a first, second, third, and fourth branches) each connected to the sensing node SN. The first branch has the twelfth and ninth NMOS transistors NM12 and NM9 coupled in series, the second branch has the eleventh and eighth NMOS transistors NM11 and NM8 coupled in series, the third branch has the tenth and seventh NMOS transistors NM10 and NM7 coupled in series, and the fourth branch has only the sixth NMOS transistor NM6. Thus, the multistep current source unit 25a preferably has $2^N$ branches for a memory cell storing N bits.

Operations of the multistep current source unit 25a will be described with reference to FIGS. 5, 6, and 7. It is assumed that the NMOS transistors have the same size, and a voltage generated between the gate and the source of the fifth NMOS transistor NM5 by the reference current Iref is a reference voltage Vref. However, the present invention is not intended to be so limited. A voltage $V_0$ at which a current starts to flow through the sixth NMOS transistor NM6 is a drain saturation voltage Vdsat of the sixth NMOS transistor NM6. Likewise, voltages at which current passes through the seventh and the tenth NMOS transistors NM7 and NM10 are threshold voltages of the tenth NMOS transistor NM10. Saturation voltage V1 of the seventh and the tenth NMOS transistors NM7 and NM10 is approximately Vref+Vdsat, saturation voltage V2 of the eighth and the eleventh NMOS transistors NM8 and NM11 is 2Vref+Vdsat, and saturation voltage V3 of the ninth and the twelfth NMOS transistors NM9 and NM12 is 3Vref+Vdsat. Here, it is assumed that there is no variation of the threshold voltage coming from variation of a substrate voltage of each of the NMOS transistors.

Figure 5:
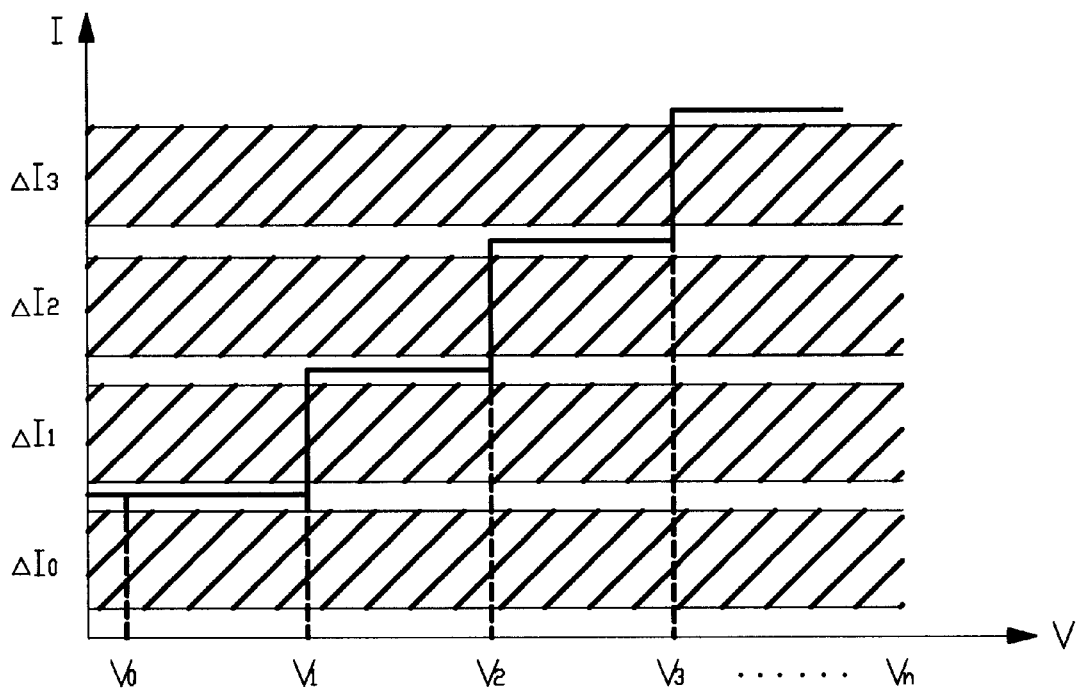

As shown in FIG. 5, an input current to the multistep current source unit 25a and an output voltage from the multistep current source unit 25a preferably show a stair like or step shaped relationship. If currents $\Delta I_0$, $\Delta I_1$, $\Delta I_2$, $\Delta I_3$, $\Delta I_3$, - - -, $\Delta In$ in hatched regions correspond to a threshold voltage distribution of the memory cell, this current distribution appear in regions with low small signal resistance, and, if the resistances are very low, the threshold voltage distribution of the memory cell corresponds to the quantized voltages of V0, V1, V2, V3, - - -, Vn in a one-to-one fashion. Thus, for the current distribution $\Delta I_0$, a corresponding voltage is the voltage $V_0$, for the current distribution $\Delta I_1$, the voltage is $V_1$, and so on. Using a circuit with such a current-voltage characteristic curve, outputs having a distribution having no relation with the original threshold voltage distribution can be obtained, as shown in FIG. 6.

Figure 6:
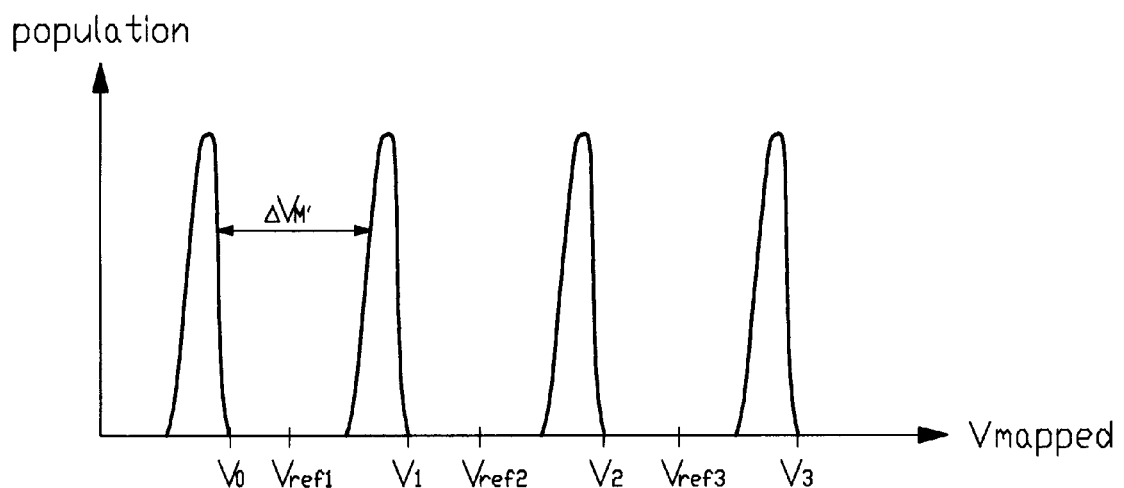

Also, as shown in FIGS. 5 and 6, as a slope of the steps of the current-voltage becomes steeper, the threshold voltage distribution becomes correspondingly narrower, providing a new voltage distribution with a greater gap $\Delta VM'$ between the threshold voltages. This allows a larger reference voltage selection width when reading a state of the memory cell to increase reliability. Thus, the multistep current source 25a repeats processes in succession, in which a current flowing through the multistep current source 25a is blocked up to a voltage level, and then the current is permitted to flow therethrough when the voltage rises over the voltage level. Because the preferred stair form of current-voltage characteristic can be provided according to the preferred embodiments, a current (i.e., threshold voltage) distribution can be mapped with the gaps between voltage distributions adjusted as necessary by adjusting the reference current Iref, the reference voltage Vref, and sizes of the NMOS transistors.

Figure 13:
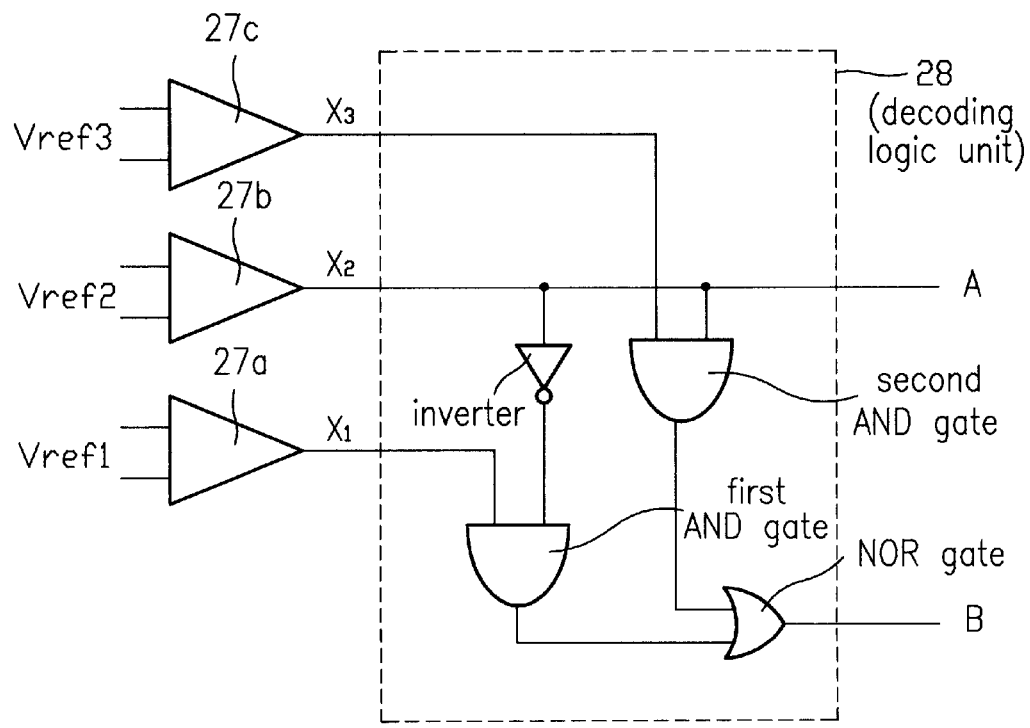
FIG. 13 is a drawing that illustrates a system of a decoding logic unit of FIG. 3.

Referring to FIG. 13, the decoding logic unit 28 includes an inverter to invert a signal from the second voltage comparing unit 27b, a first AND gate for logically combining the output of the inverter with a signal from the first voltage comparing unit 27a and a second AND gate for logically combining outputs from the second and third voltage comparing units 27c and 27b. A NOR gate logically combines the outputs of the first and second AND gates and forwards the output to a B terminal. An A terminal is provided with an output signal from the second voltage comparing unit 27b.

A third preferred embodiment being a method for sensing a data in a multibit memory cell according to the present invention will next be described with reference to multi-bit memory cells having four levels of threshold voltage distribution. The third preferred embodiment can be performed, for example, by the second preferred embodiment including the multistep current source unit 25a. It should be understood that the description can be extended to multi-bit memory cell with N threshold voltage distribution. For example, to convert a four level threshold voltage distribution into four quantized voltages, a multistep current source unit with four steps is required. For a memory cell with an N bit data storage, a multistep current source unit with $2^N$ steps is required, together with ($2^N-1$) voltage comparing units.

Figure 7:
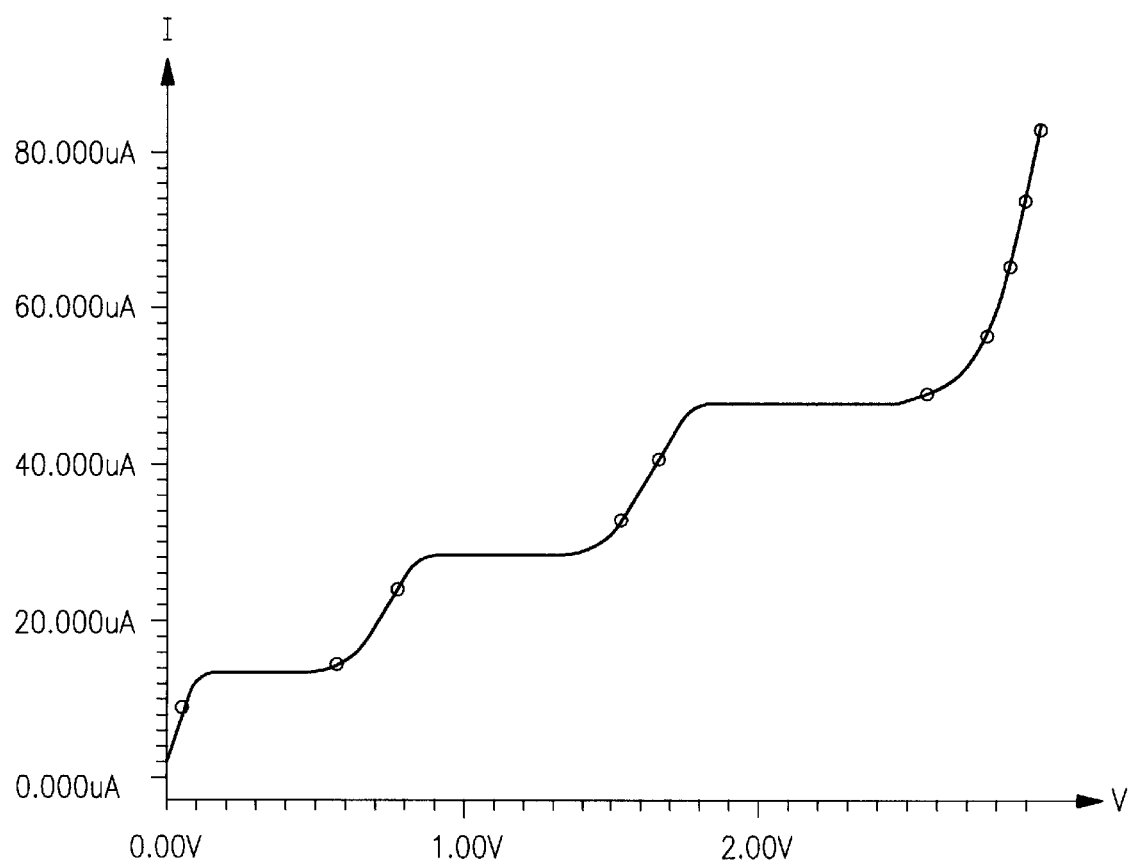
FIG. 7 is a drawing that illustrates simulation data showing a current-voltage characteristic of the multistep current source unit of FIG. 4b.

Referring to FIG. 7, the first, second, and third reference voltages Vref1, Vref2, and Vref3 from the reference voltage generating unit 26 are given as Vref1=(V0+V1)/2, Vref2=(V1+V2)/2, and Vref3=(V2+V3)/2. The references voltages Vref1, Vref2 and Vref3 can be implemented with a device from a voltage distributor and the like because high precision is not required.

As shown in FIG. 4a, one bitline to the memory cell array unit 21 is selected through the bitline selecting unit 22. Then, current is provided to the sensing node SN through the current mirror 24, which current is substantially identical to a current flowing through the selected bitline and corresponding to threshold voltages of the memory cell. The voltage on the selected bitline is held constant by the bitline voltage clamping unit 23.

Referring to FIGS. 4a, 4b, 5, and 6, if the current provided to the sensing node SN is in a range of $\Delta I_0$, a voltage $V_0$ is provided to the sensing node SN through the multistep current source unit 25a. Then, the voltage $V_0$ provided to the sensing node SN is forwarded to the first, second, and third voltage comparing units 27a, 27b, and 27c and compared to the first, second, and third reference voltages Vref1, Vref2, and Vref3, respectively. In this instance, since the voltage $V_0$ is lower than the first, second, and third reference voltages Vref1, Vref2, and Vref3, low signals L are provided through each of the terminals the X1, X2, and X3, to output 0 at terminal A and 0 at terminal B on the decoding logic unit 28. Accordingly, it can be sensed that the data stored in the memory cell is programed to level 00 of the four levels 00, 01, 10, and 11.

Next, if the current provided to the sensing node SN is in a range of $\Delta I_1$, a voltage V1 is provided to the sensing node SN through the multistep current source unit 25a. Then, the voltage V1 provided to the sensing node SN is forwarded to the first, second, and third voltage comparing units 27a, 27b, and 27c and compared to the first, second, and third reference voltages Vref1, Vref2, and Vref3, respectively. In this instance, since the voltage $V_1$ is higher than the first reference voltage Vref1 and lower than the second and third reference voltages Vref2 and Vref3, a high signal H is provided through the terminal X1, and low signals L are provided through the other terminals X2 and X3 to provide 0 and 1 to the A and B terminals, respectively, on the decoding logic unit 28. Accordingly, it can be sensed that the data stored in the memory cell is programed to level 01 of the four levels 00, 01, 10, and 11.

If the current provided to the sensing node SN is in a range of $\Delta I_2$, a voltage $V_2$ is provided to the sensing node SN through the multistep current source unit 25a. Then, the voltage $V_2$ provided to the sensing node SN is forwarded to the first, second, and third voltage comparing units 27a, 27b, and 27c and compared to the first, second, and third reference voltages Vref1, Vref2, and Vref3, respectively. In this instance, since the voltage $V_2$ is higher than the first and second reference voltages Vref1 and Vref2 and lower than the third reference voltage Vref3, high signals H are provided through the terminal X1 and X2, and a low signal L is provided through the terminal X3, to provide 1 and 0 to the A and B terminals, respectively, on the decoding logic unit 28. Accordingly, it can be sensed that the data stored in the memory cell is programed to level 10 of the four levels 00, 01, 10, and 11.

Finally, if the current provided to the sensing node SN is in a range of $\Delta I_3$, a voltage $V_3$ is provided to the sensing node SN through the multistep current source unit 25a. Then, the voltage $V_3$ provided to the sensing node SN is forwarded to the first, second, and third voltage comparing units 27a, 27b, and 27c and compared to the first, second, and third reference voltages Vref1, Vref2, and Vref3, respectively. In this instance, since the voltage $V_3$ is higher than the first, second, and third reference voltages Vref1, Vref2, and Vref3, high signals H are provided through each of the terminals X1, X2, and X3, to provide 1 and 1 to the A and B terminals, respectively, on the decoding logic unit 28. Accordingly, it can be sensed that the data stored in the memory cell is programed to level 11 of the four levels 00, 01, 10, and 11.

Figure 8:
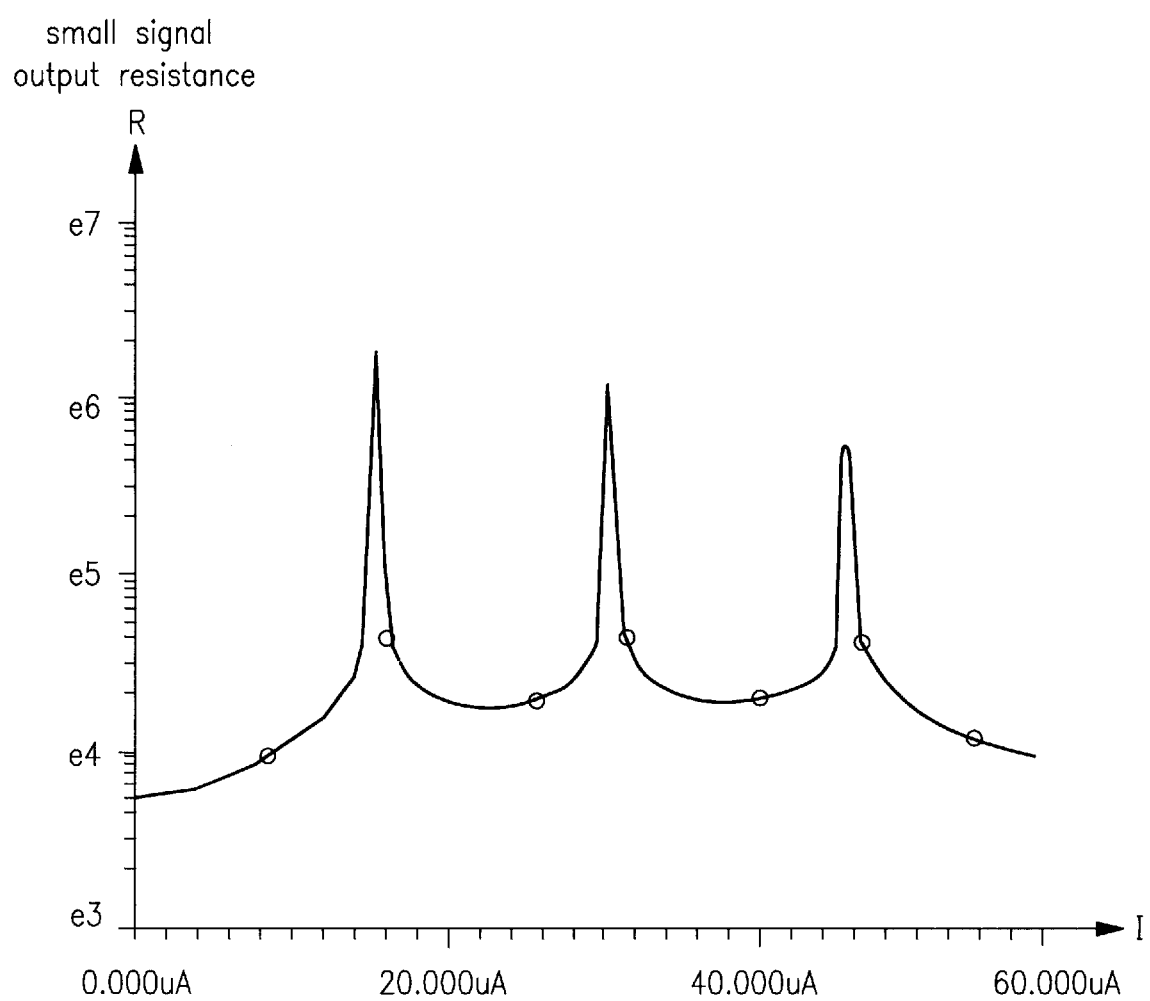

FIG. 7 illustrates simulation data showing a current-voltage characteristic of the multistep current source unit 25a in the second preferred embodiment of a device for sensing data according to the present invention and FIG. 8 illustrates simulation data showing a small signal output resistance of the multistep current source unit 25a when a voltage is leveled up and held at the level in FIG. 7. Sections in which the currents increase in FIG. 7, i.e., concave sections in FIG. 8, are defined as "allowed bands" in which a current can flow to the multistep current source unit 25a through the sensing node SN. Additionally, sections in FIG. 8 in which the small signal output resistances increase sharply are defined as "forbidden bands" in which the current cannot flow to the multistep current source unit 25a through the sensing node SN. Thus, as the currents flowing through the multistep current source unit 25a and the characteristic of the small signal output resistances become more ideal, the allowed bands become wider and the forbidden bands become narrower. That is, even if a width of each threshold voltage is large and the gap between the threshold voltages is small, a programed state of the memory cell can be precisely determined.

Figure 9:
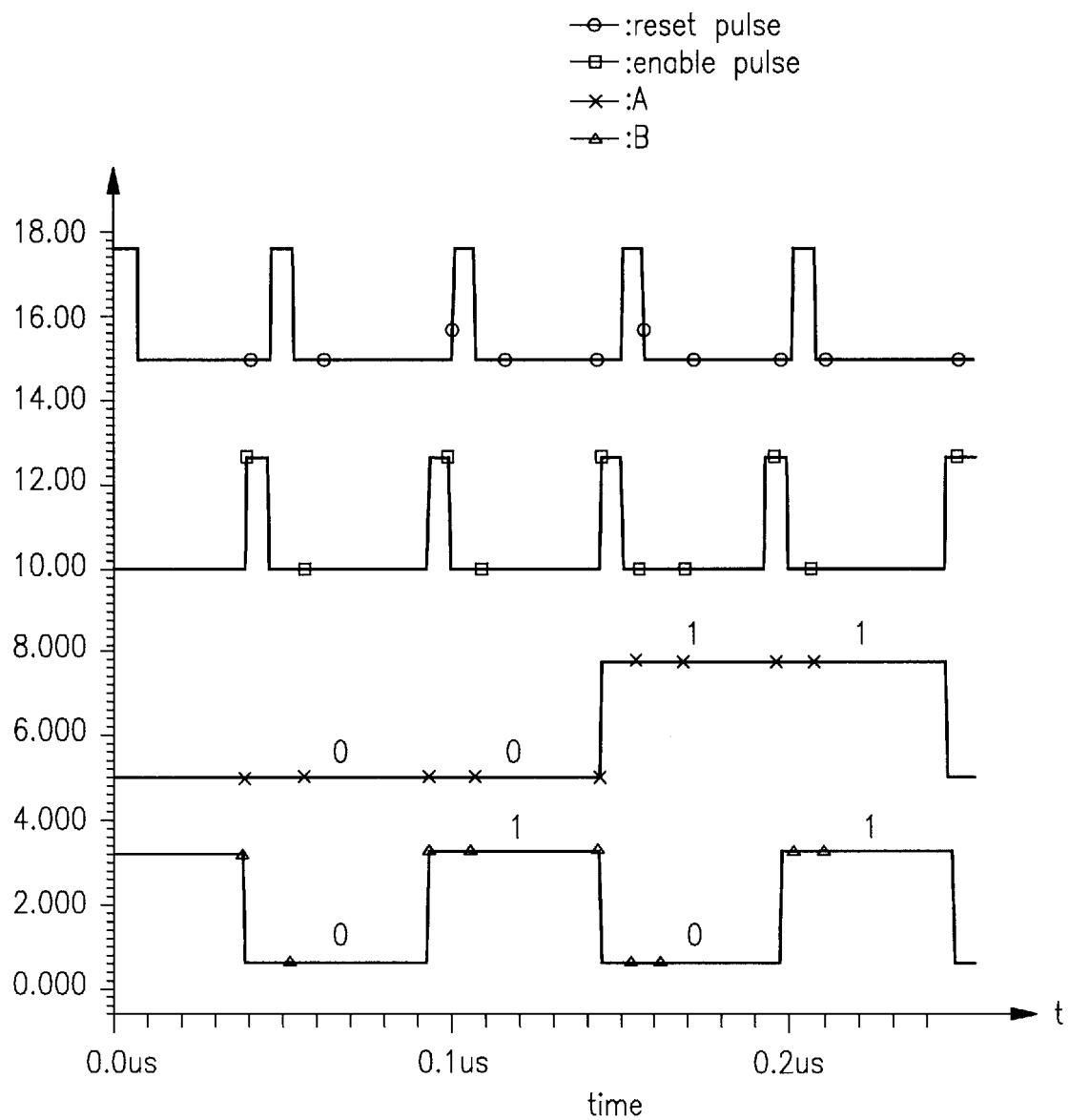
FIG. 9 is a drawing that illustrates simulation data showing an operation for sensing data stored in a two bit (four level threshold voltage) memory cell.

FIG. 9 illustrates simulation data showing that two bit memory cell data (four levels 00, 01, 10, 11) is properly provided to the output terminals A and B on the decoding logic unit 28 when reset pulses and enable pulses are applied to the device for sensing data in a multi-bit memory cell according to preferred embodiments of the present invention.

Figure 10:
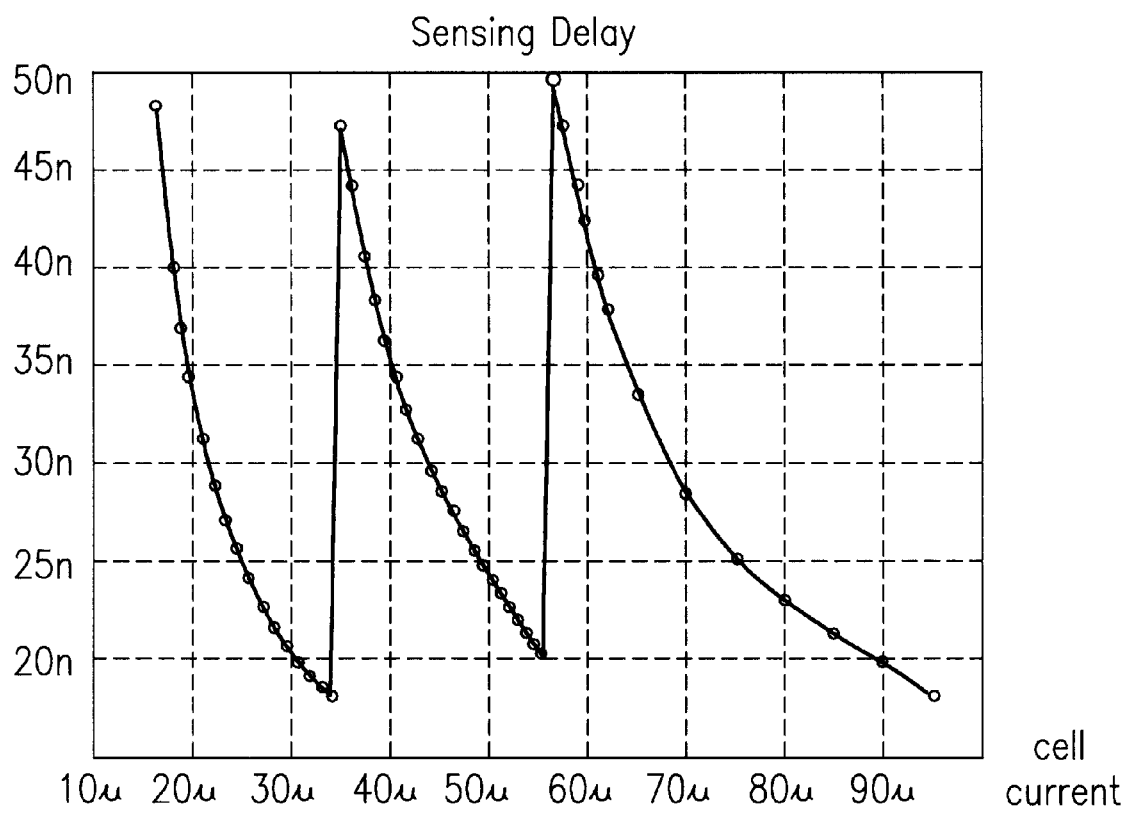
FIG. 10 is a drawing that illustrates simulation data showing a variation of a sensing delay time for obtaining a quantized threshold voltage distribution.

FIG. 10 illustrates a result of simulation of sensing delays obtained by increasing the current to the sensing node SN by 10 $\mu$A in succession until a stable signal is provided to the decoding logic unit 28. Referring to FIGS. 7 and 10, it can be seen that the sensing delay increases sharply every time the addressed data state (00, 01, 10, 11) of the memory cell is changed. That is, sections with great sensing delays fall on flat sections, i.e., the forbidden bands in FIG. 7. The sensing delays range from a minimum of approximately 20 ns to a maximum of approximately 50 ns. In determining sizes of the allowed band and the forbidden band, a desired sensing delay is fixed to set sections larger than the sensing delay to be forbidden bands and sections smaller than the sensing delay to be the allowed bands.

Figure 11:
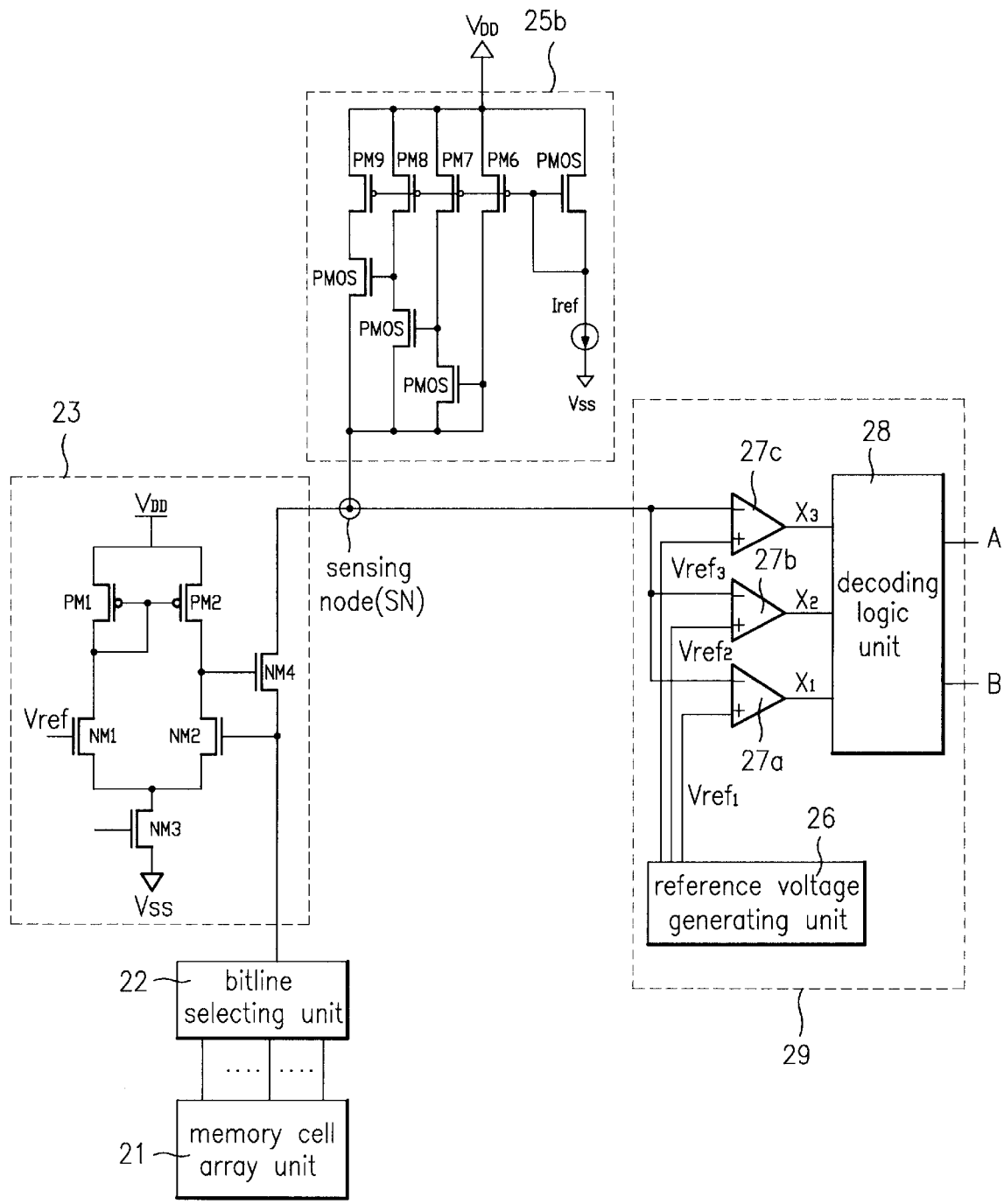
FIG. 11 is a drawing that illustrates a block diagram of a device for sensing data in a multi-bit memory cell in accordance with another preferred embodiment of the present invention.

FIG. 11 illustrates a block diagram of a device for sensing a data in a multi-bit memory cell according to a fourth preferred embodiment of the present invention, which is similar to the second embodiment as shown in FIG. 4a, except for the multistep current source unit 25b, and the removal of the current mirror 24 with the PM3 and PM4 in the second preferred embodiment of a device for sensing data in a multi-bit memory cell. According to the fourth preferred embodiment, an output of the multistep current source unit 25b is directly coupled to the drain terminal of the NM4 in the bitline voltage clamping unit 23, locations of the source voltage $V_{DD}$ and the ground voltage $V_{SS}$ are exchanged, and a flow direction of the reference current Iref is turned to an opposite direction.

Figure 12:
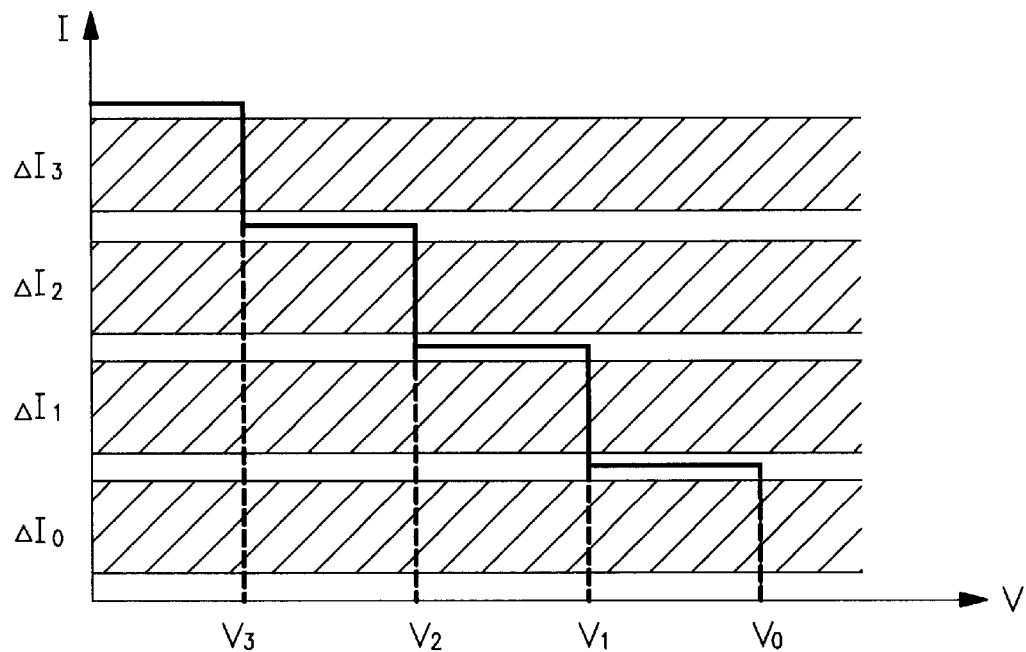
FIG. 12 is a drawing that illustrates a multistep type current-voltage characteristic of a multistep current source unit of FIG. 11.

FIG. 12 is a diagram that illustrates a multistep type current-voltage characteristic of the multistep current source unit 25b of FIG. 11, wherein a stair type current-voltage characteristic preferably opposite to that of the second preferred embodiment of the present invention is shown. Absolute values of the voltages provided in correspondence to the currents provided to the sensing node SN are $|V_0|>|V_1|>|V_2|>|V_3|$.

As described above, the preferred embodiments of a device and method for sensing a data in a multi-bit memory cell according to the present invention have various advantages. First, by providing a quantized voltage distribution narrower than the threshold voltages of a multi-bit memory cell through the multistep current source unit, comparing the quantized voltages to respective reference voltages, and outputting a state of the memory cell in binary data, the degradation of the sensing reliability caused by factors such as temperature or voltage variation can be reduced. Further, the preferred embodiments can increase sensing reliability. Using a threshold voltage distribution having gaps greater than gaps between the threshold voltage distribution of an actual multi-bit memory cell, i.e., by increasing a reading allowance, a sensing reliability of the memory cell can be increased. Third, because the sensing can be done using a threshold voltage distribution having voltage distribution widths smaller than the threshold voltage distribution of an actual multi-bit memory cell and gaps larger than the threshold voltage distribution of actual multi-bit memory cell, a greater number of charge storage states can be made available from one memory cell.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A device to sense data in a multi-bit memory cell, comprising:

a memory cell array, wherein each memory cell of the memory cell array has at least two threshold voltage levels; and a multistep converter coupled to the memory cell array that provides first voltages having first voltage distributions, each having a width smaller than a corresponding threshold voltage distributions for the at least two threshold voltages for a selected memory cell of said memory cell array.

2. The device of claim 1, wherein the multistep converter comprises:

a multistep current source that provides quantized voltages at a sensing node having said first voltage distributions; and a comparator to compare the quantized voltages and a plurality of reference voltages to output a state of the selected memory cell.

3. The device of claim 2, further comprising:

a bitline selector to select a bitline from said memory cell array;

a voltage clamping circuit to hold a voltage on the selected bitline substantially constant; and a current mirror to supply a current substantially identical to a current flowing through the bitline to the sensing node, wherein said bitline selector, said voltage clamping circuit, and said current mirror are coupled in series between said memory cell array and said multistep converter.

4. The device of claim 2, wherein said comparator comprises an analog-to-digital converter that outputs binary data corresponding to the state of the memory cell.

5. The device of claim 4, wherein the analog-to-digital converter comprises:

a reference voltage generator to distribute reference voltages;

a voltage comparator having a plurality of voltage comparator circuits, each receiving a corresponding reference voltage to compare with the quantized voltages received from the multistep current source; and a decoder coupled to the voltage comparator that converts outputs of the voltage comparator to the binary data.

6. The device of claim 2, wherein the multistep current source comprises $2^N$ branches if the memory cell has threshold voltage levels of N bits stored therein.

7. The device of claim 6, wherein said multistep current source comprises:

first and second transistors coupled in series in the first branch;

third and fourth transistors coupled in series in the second branch;

fifth and sixth transistors coupled in series in the third branch;

a seventh transistor having a drain terminal coupled to the fourth branch;

an eighth transistor having a control electrode coupled to control electrodes of the second, fourth, sixth, and seventh transistors, respectively, wherein a second electrode and the control electrode of the eighth transistor are coupled together to the control electrode thereof; and a reference current supply unit coupled to the second electrode of the eighth transistor.

8. The device of claim 2, wherein a current-voltage characteristic curve of the multistep current source has a stair form with sections of high and low resistances repeatedly provided in sequence so that currents in particular sections have a one-to-one correspondence to particular voltages, respectively, to increase gaps between the first voltage distributions for the selected memory cell that correspond to the threshold voltage distributions for the at least two threshold voltages for the selected memory cell.

9. A device for sensing a data in a multi-bit memory cell, comprising:

a memory cell array having a plurality of memory cells, wherein each of the memory cells is coupled to a corresponding wordline and a corresponding bitline and has at least two threshold voltage levels;

a bitline selector that selects a memory cell from said memory cell array;

a current mirror that supplies a current to a sensing node the current being substantially identical to a current flowing through the corresponding bitline coupled to the selected memory cell;

a multistep distributor coupled to the current mirror that provides first voltages having a first voltage distribution being narrower for each of the first voltages than a corresponding threshold voltage distribution for the selected memory cell; and an analog-to-digital converter that compares the first voltages supplied to the sensing node and reference voltages to decode a state of the memory cell.

10. The device of claim 9, wherein the multistep distributor is a multistep current source that provides quantized voltages at the sensing node as said first voltages.

11. The device of claim 9, wherein said analog-to-digital converter comprises:

a reference voltage generator that distributes said reference voltages being a plurality of prescribed reference voltages;

a comparator having a plurality of voltage comparators, each receiving a corresponding reference voltage to compare quantized voltages provided to the sensing node to ones of the plurality of reference voltages, wherein said comparator comprises $2^N-1$ voltage comparators when the selected memory cell has threshold voltage levels of N bits stored therein; and a decoding logic unit that receives outputs of the comparator and converts the outputs into binary data.

12. The device of claim 10, wherein the selected memory cell has a plurality of current level distribution according to the threshold voltage level distribution, wherein a current-voltage characteristic curve of the multistep current source has a stair form with sections of high and low resistances repeatedly provided in sequence so that currents in successive low resistance sections correspond to one of the threshold voltages, respectively, to reduce widths of the threshold voltage level distribution.

13. The device of claim 12, wherein a reference voltage generator provides voltages at approximately a midpoint of each of the low resistance sections from the multistep current source with the stair form current-voltage characteristic curve as the reference voltages.

14. The device of claim 10, wherein said multistep current source comprises $2^N$ branches where the memory cells have threshold voltage levels of N bits stored therein.

15. The device of claim 14, wherein each of said branches has a first end coupled to a current source and a second end coupled to the sensing node, wherein the second ends are either coupled directly to the sensing node or coupled to the sensing node through at least one switch.

16. The device of claim 15, wherein the at least one switch cuts off while a voltage on the first and second ends of the multistep current source enters a range according to the current provided to the sensing node, and the current is permitted to flow in sequence when the voltage is out of the range, for corresponding fixed voltage ranges.

17. The device of claim 14, wherein the multistep current source includes first, second, third, and fourth branches, wherein each of the branches has a switch, and wherein the memory cells have threshold voltage levels of two bits stored therein.

18. The device of claim 17, wherein said multistep current source comprises:

- first and second transistors coupled in series in the first branch;
- third and fourth transistors coupled in series in the second branch;
- fifth and sixth transistors coupled in series in the third branch;
- a seventh transistor having a drain terminal coupled to the fourth branch;
- an eighth transistor having a control electrode coupled to control electrodes of the second, fourth, sixth, and seventh transistors, respectively, wherein a second electrode and the control electrode of the eighth transistor are coupled together to the control electrode thereof; and
- a reference current supply unit coupled to the second electrode of the eighth transistor.

19. The device of claim 18, wherein a control electrode of said fifth transistor is coupled to a second electrode of said seventh transistor, a control electrode of said third transistor is coupled to a second electrode of said sixth transistor, a control electrode of said first transistor is coupled to a second electrode of said fourth transistor.

20. The device of claim 19, wherein first electrodes of said second, fourth, sixth, and seventh transistors are coupled to a first reference voltage terminal and a current source is coupled to a second reference voltage terminal when the first to eighth transistors are NMOS transistors, and wherein first electrodes of said second, fourth, sixth, and seventh transistors are commonly coupled to the second reference voltage terminal and the current source is coupled to the first reference voltage ground terminal when said first to eighth transistors are PMOS transistors, and wherein the first, second and control electrodes are source, drain and gate electrodes, respectively.

21. The device of claim 11, wherein said decoding logic unit outputs one of four logics 00, 01, 10, and 11 when the selected memory cell is in storage of 4 bits of threshold voltage levels.

22. The device of claim 11, wherein said decoding logic unit comprises:

- a first output terminal to output a signal from a first voltage comparator of said plurality of voltage comparators;
- an inverter to invert the signal from the first voltage comparator;
- a first logic gate that logically combines an output of the inverter with an output signal from a second voltage comparator of said plurality of voltage comparators;
- a second logic gate that logically combines output signals of the first and third voltage comparators of said plurality of voltage comparators; and
- a third logic gate that logically combines output signals of the first and second logic gates and outputs a signal to a second output terminal.

23. The device of claim 22, wherein said first and second logic gates comprise AND gates and said third logic gate comprises a NOR gate.

24. The device of claim 9, further comprising a bitline voltage clamp between the bitline selector and the current mirror that clamps a voltage on the corresponding bitline coupled to the memory cell and holds the voltage substantially constant.

25. A method of reading data in a memory cell in a cell array, comprising the steps of:

- selecting a memory cell from an array of memory cells having first threshold voltage distributions;
- providing a current substantially identical to a current of the selected memory cell to a sensing node;
- providing a second voltage to the sensing node corresponding to the current at the sensing node, wherein the second voltage has a narrower distribution width than a corresponding distribution width of the first threshold voltage distribution of the selected memory cell;
- comparing the second voltage to a reference voltage to determine a state of the selected memory cell.

* * * * *